United States Patent
Arevalo et al.

(10) Patent No.: US 7,562,001 B2
(45) Date of Patent: Jul. 14, 2009

(54) CREATING A BEHAVIORAL MODEL OF A HARDWARE DEVICE FOR USE IN A SIMULATION ENVIRONMENT

(75) Inventors: Abraham Arevalo, Shakopee, MN (US); Robert C. Dixon, Austin, TX (US); Alan G. Singletary, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 11/193,821

(22) Filed: Jul. 29, 2005

(65) Prior Publication Data

US 2007/0050758 A1 Mar. 1, 2007

(51) Int. Cl.
G06F 17/50 (2006.01)
G01R 13/00 (2006.01)
G01D 3/00 (2006.01)

(52) U.S. Cl. .............................. 703/14; 702/66; 702/108
(58) Field of Classification Search .................... 703/14; 702/66, 108
See application file for complete search history.

(56) References Cited

U.S. PATENT DOCUMENTS

| | | | |
|---|---|---|---|
| 4,306,286 A | 12/1981 | Cocke et al. | |
| 4,914,612 A | 4/1990 | Beece et al. | |
| 5,557,774 A | 9/1996 | Shimabukuro et al. | |
| 5,566,295 A | 10/1996 | Cypher et al. | |
| 5,960,182 A | 9/1999 | Matsuoka et al. | |
| 6,047,387 A | 4/2000 | Chang et al. | |
| 6,052,524 A | 4/2000 | Pauna | |
| 6,389,379 B1* | 5/2002 | Lin et al. | 703/14 |
| 6,678,645 B1* | 1/2004 | Rajsuman et al. | 703/20 |
| 2002/0173942 A1* | 11/2002 | Rajsuman et al. | 703/14 |
| 2003/0093773 A1 | 5/2003 | Reed et al. | |

OTHER PUBLICATIONS

"Testing the Design: The Evolution of Test Simulation", Craig Force, Texas Instruments-Mixed Signal Products. 1998 IEEE.*

* cited by examiner

*Primary Examiner*—Paul L Rodriguez
*Assistant Examiner*—Nithya Janakiraman
(74) *Attorney, Agent, or Firm*—Biggers & Ohanian, LLP

(57) ABSTRACT

Exemplary methods, apparatuses, and products are described for creating a behavioral model of a hardware device for use in a simulation environment. The behavioral model is created by an iterative process that includes receiving in a simulated hardware device from a simulated device under test ('DUT') a stimulus waveform. The stimulus waveform includes data representing a number of stimuli. In response to receiving the stimulus waveform, the simulated hardware device presents a recorded response waveform from a recorded response file to the DUT. The stimulus waveform is also recorded. The recorded stimulus waveform is presented to the hardware device. A response waveform that results from presenting the recorded stimulus waveform to the hardware device is recorded in the recorded response file.

14 Claims, 8 Drawing Sheets

CREATING A BEHAVIORAL MODEL OF A HARDWARE DEVICE FOR USE IN A SIMULATION ENVIRONMENT

BACKGROUND OF THE INVENTION

1. Field of the Invention

The field of the invention is data processing, or, more specifically, methods, apparatuses, and products for creating a behavioral model of a hardware device for use in a simulation environment.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

A 'system-on-a-chip' ('SOC') is a technique of integrating all components of a computer system into a single chip. An SOC may contain digital, analog, mixed-signal, and radio-frequency functions—all on one chip. A typical computer system consists of a number of integrated circuits that perform different tasks. Examples of such integrated circuits include microprocessors, memory (RAM, ROM), UARTs, parallel ports, DMA controller chips, and so on. Recent improvements in semiconductor technology have allowed VLSI integrated circuits to grow in complexity, making it possible to integrate all components of a system in a single chip. This can be done in a number of technologies including, for example, full-custom development, standard cell architectures, and field programmable gate arrays ('FPGAs'), and complex programmable logic arrays ('CPLAs'). SOC designs typically consume less power, cost less, and are more reliable than multi-chip systems. And with fewer packages in a system, assembly costs are reduced as well.

A typical application for an SOC is an 'embedded system.' An embedded system is a special-purpose computer system, which is completely encapsulated by the device it controls. An embedded system has specific requirements and performs pre-defined tasks, unlike a general-purpose personal computer.

Examples of embedded systems include:
automatic teller machines ('ATMs');
cellular telephones and telephone switches;
computer network equipment, routers, timeservers and firewalls;
computer printers;
copiers;
floppy disk drives, hard disk drives, CD ROM drives, DVD ROM drives;
engine controllers and antilock brake controllers for automobiles;
home automation products, thermostats, air conditioners, sprinklers, security monitoring systems;
handheld calculators;
household appliances, microwave ovens, washing machines, television sets, DVD players/recorders;
inertial guidance systems, flight control hardware/software and other integrated systems in aircraft and missiles;
medical equipment;
measurement equipment such as digital storage oscilloscopes, logic analyzers, and spectrum analyzers;
multifunction wristwatches;
multifunctional printers ('MFPs');
personal digital assistants ('PDAs'), small handheld computers with personal information managers ('PIMs') and other applications;
mobile phones with additional capabilities, for example, mobile digital assistants with cellphone, PDA (functions, and Java capabilities;
programmable logic controllers ('PLCs') for industrial automation and monitoring;
stationary videogame consoles and handheld game consoles; and
wearable computers.

In designing SOC devices, it is common to perform extensive simulation to verify a design's correctness before producing first prototypes. This simulation includes the design under test ('DUT') and a surrounding environment (sometimes called a 'simulation environment' or 'test bench') which simulates as closely as possible the conditions in which the actual SOC will operate. If an SOC will have connections to external devices, such as memories, busses or communication channels, these devices are commonly represented in the simulation by models written in a hardware description language ('HDL') such as VHDL or Verilog. These models may be representative of a single vendor implementation of the device or may be a generic model of some defined bus. As such, they may not reliably represent the actual behavior of the devices to which the SOC will eventually be attached. In particular, variations of device behavior under changes in operating conditions such as voltage, frequency, and temperature are difficult to represent accurately in an HDL model. Normally, any such parametric behavior is discovered only during hardware testing, when changes to the design are much more difficult and expensive.

In addition, there are circumstances when an HDL model that simulates the operations of an external device is not available and is not practical to create by direct programming in an HDL. There may be several reasons for this, including unknown or unpredictable response of the device to changes in voltage or frequency. The internal workings of the external device may be unknown to the SOC designers, perhaps due to encoding for security reasons or to proprietary intellectual property within.

SUMMARY OF THE INVENTION

Exemplary methods, apparatuses, and products are described for creating a behavioral model of a hardware device for use in a simulation environment. The behavioral model is created by an iterative process that includes receiving in a simulated hardware device from a simulated device under test ('DUT') a stimulus waveform. The stimulus waveform includes data representing a number of stimuli. In response to receiving the stimulus waveform, the simulated hardware device presents a recorded response waveform from a recorded response file to the DUT.

The stimulus waveform is also recorded. Typically, the recorded stimulus waveform is transferred to a device interface tool. The recorded stimulus waveform is presented to the hardware device. A response waveform that results from presenting the recorded stimulus waveform to the hardware device is recorded in the recorded response file. Typically, the response waveform from a device interface tool is then transferred to the simulation environment.

The recorded response waveform may be synchronized to the stimulus waveform while presenting the recorded response waveform to the DUT. For example, synchronizing the recorded response waveform to the stimulus waveform may be accomplished by recording delay data representing delays between presentation of a response and receipt of a next stimulus as part of recording the stimulus waveform and recording delay data representing a delay between receipt of a stimulus and presentation of a corresponding response as part of recording a response waveform.

In some embodiments, creating the behavior model of the hardware device in the simulation environment includes determining whether an additional iteration is required. In such embodiments, determining whether an additional iteration is required may include counting the number of stimuli in the recorded stimulus waveform of a previous simulation run. The number of stimuli in the stimulus waveform of the present simulation run is also counted. An additional iteration is made if the count of stimuli in the present simulation run exceeds the number of stimuli in the recorded stimulus waveform of a previous simulation run. In an embodiment, determining whether an additional iteration is required includes comparing the stimulus waveform of the present simulation run with the recorded stimulus waveform of the previous simulation run. If the stimulus waveform of the present simulation run and the recorded stimulus waveform of the previous simulation run are not identical and additional iteration is made.

Counting stimuli is one method for determining whether an additional iteration is required. Another method for determining whether an additional iteration is required is to compare the two waveforms beginning at a timestamp where the last difference was detected, rather that comparing from the beginning on each iteration.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
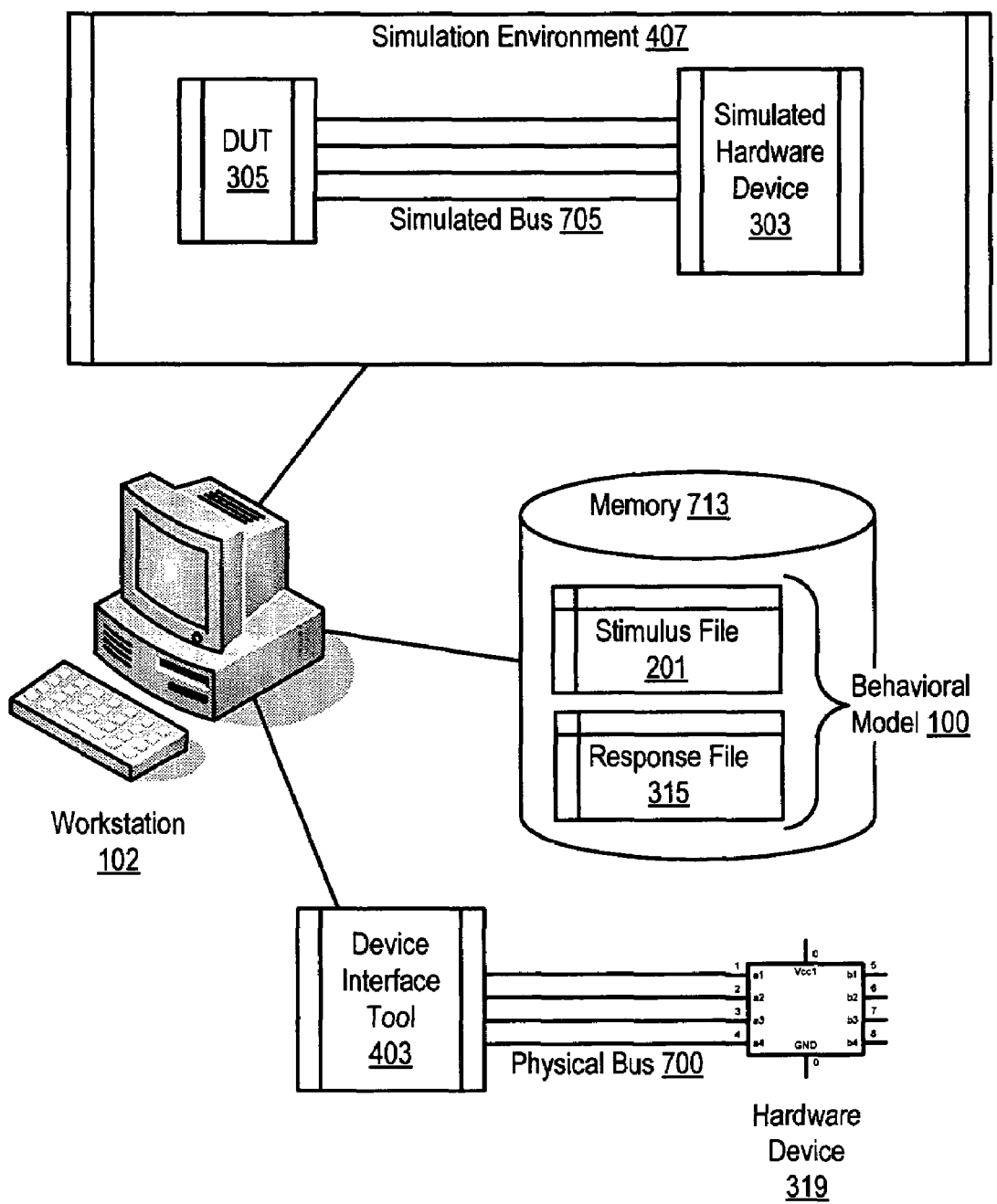
FIG. 1 sets forth a system diagram illustrating an exemplary system for creating a behavioral model of a hardware device for use in a simulation environment according to embodiments of the present invention.

Exemplary methods, apparatuses, and products for creating a behavioral model of a hardware device for use in a simulation environment according to embodiments of the present invention are described with reference to the accompanying drawings, beginning with FIG. 1. FIG. 1 sets forth a system diagram illustrating an exemplary system for creating a behavioral model of a hardware device for use in a simulation environment according to embodiments of the present invention. The system of FIG. 1 operates generally to create a behavioral model of a hardware device for use in a simulation environment according to embodiments of the present invention by receiving, in a simulated hardware device (303) from a simulated device under test ('DUT') (305) a stimulus waveform. The stimulus waveform includes data representing a number of stimuli. The stimulus waveform is recorded in a stimulus file (201). Responsive to receiving the stimulus waveform, the simulated hardware device presents to the DUT, a recorded response waveform from a recorded response file (315). The recorded stimulus waveform is presented to the hardware device (319). A response waveform that results from presenting the recorded stimulus waveform to the hardware device is recorded in the recorded response file (315).

In the system of FIG. 1 includes a workstation (102) that implements a simulation environment (407) that includes a DUT (305) and a simulated hardware device (303). The DUT is a HDL simulation of an SOC under design, and the simulated hardware device is an HDL simulation (303) of an actual hardware device intended to operate as part of the SOC's actual hardware environment when the SOC is eventually implemented in silicon. The HDL simulation (303) of an actual hardware device operates according to a behavioral model (100) that includes a recorded stimulus waveform in a stimulus file (201) and a recorded response waveform in a response file (315). At the beginning of the process of creating a behavioral model of a hardware device according to embodiments of the present invention, the stimulus file (201) and the response file (315) may be empty. That is, no behavioral model exists because it is not otherwise available from the manufacturer of the hardware device. Perhaps the manufacturer believes that the internal operations of the part are proprietary. Perhaps the manufacturer simply does not wish to undertake the expense of producing a published HDL model of the hardware device. For some reason, however, the model does not exist, and it is impractical to model it entirely in HDL. The stimulus file therefore, according to embodiments of the present invention, is built by iteratively recording stimuli signals presented by the DUT to the simulated hardware device in the simulation environment, and the response file is built up by iteratively recording responses to the same stimuli from the actual hardware device (319).

The system of FIG. 1 also includes the hardware device to be simulated, that is, an actual hardware device (319). Hardware device (319) may be in electronic communication with a data processing system such as workstation (102) that implements a simulation environment (407) coupled as here by a physical bus (700) through a device interface tool (403). In some embodiments, communications between hardware device (319) and a data processing system implementing a simulation environment may take place by manually transferring a memory device between the data processing system and the hardware device (319) or a device interface tool (403).

A device interface tool (403) is a computer module, hardware and software, that presents a recorded stimulus waveform from a stimulus file to an actual hardware device and records in the response file the response waveform that results from the hardware device in response to the stimulus waveform. In some embodiments, the device interface tool (403) includes a field programmable gate array ('FPGA'). In such embodiments, the FPGA is programmed to emulate the SOC to the hardware device, playing back the stimulus waveform over a physical bus (700) to the actual pins and actual voltages that the hardware device actually expects to see from the SOC. The stimulus waveform may be recorded on the FPGA, that is, transferred in its entirety, for presentation to the hardware device (319). Additionally, the FPGA records the response waveform that results from presenting the recorded stimulus waveform to the hardware device (319). Alternately, the FPGA directs the response waveform to a memory where the response waveform is recorded.

Figure 2:
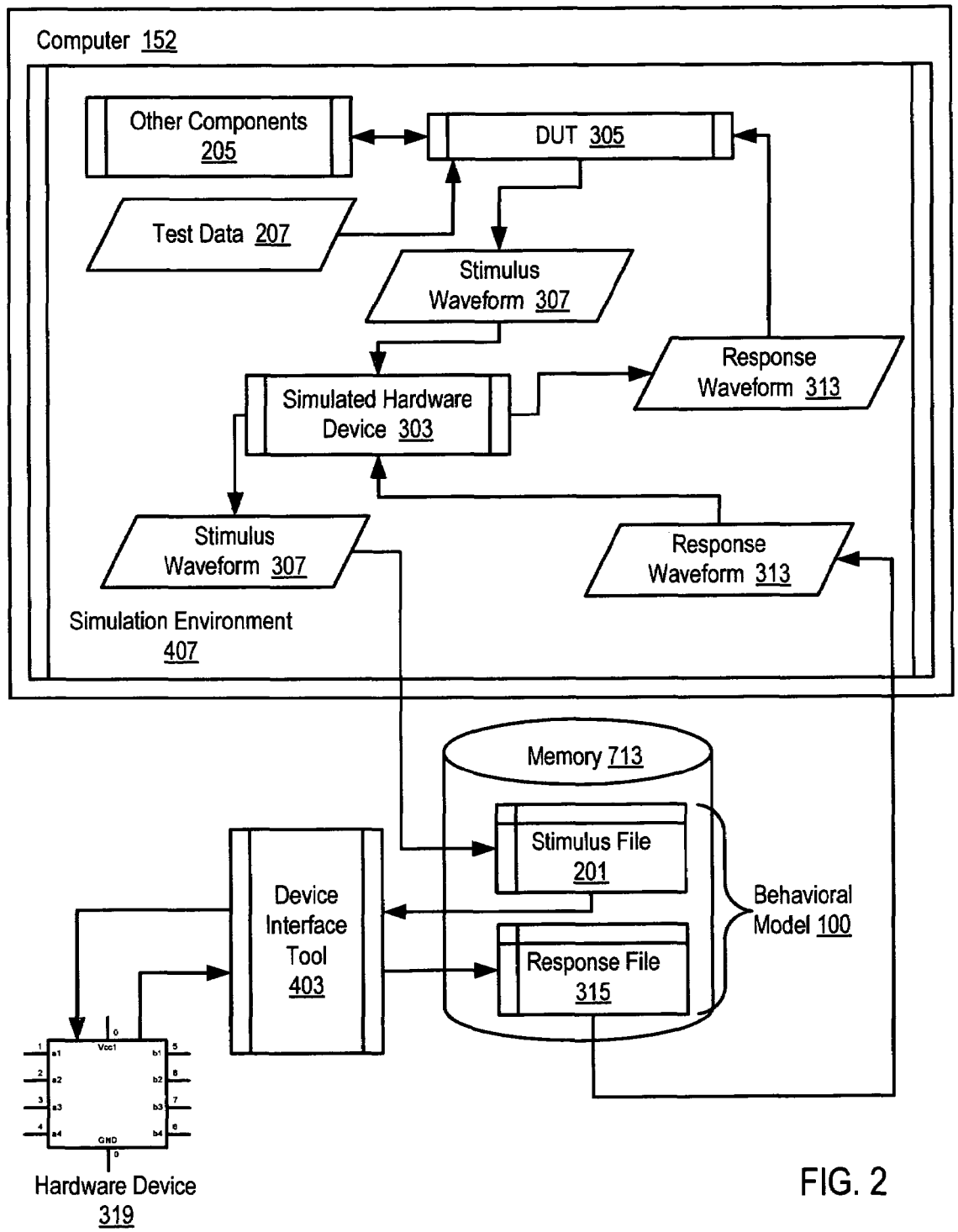
FIG. 2 sets forth a block diagram of an exemplary system for creating a behavioral model of a hardware device for use in a simulation environment according to embodiments of the present invention.

FIG. 2 sets forth a block diagram of an exemplary system for creating a behavioral model of a hardware device for use in a simulation environment according to embodiments of the present invention. The exemplary system of FIG. 2 includes a computer (152) implementing a simulation environment (407). Additionally, the system of FIG. 2 includes a hardware device (319) to be simulated and a memory (713). Simulation environment (407) may be one or more software modules expressed in a hardware description language ('HDL'). Suitable HDLs include, but are not limited to, Verilog, VHDL, ABEL HDL, AHDL, CUPL, JHDL, and PALASM. The simulation environment is programmed to simulate a device under test ('DUT') (305) and a simulated hardware device (303). The simulation environment may also simulate one or more other computer components (205).

The DUT (305) is a device in design stage. That is, the device simulated by the DUT is not yet in production. The simulation environment (407) is used to test the design to increase the likelihood that the device simulated by the DUT will function as desired when it is produced. Once the device simulated by the DUT is produced, it will need to interact with other computer components. Simulation environment (407) allows the DUT to interact with simulations of other components (205). However, simulations of some hardware devices may not be readily available or available hardware device simulations may not be satisfactory. For example, in the system depicted in FIG. 2, no suitable simulation of hardware device (319) is available. The system of FIG. 2 may be used to create a behavior model of hardware device (319) in simulation environment (407).

In the system of FIG. 2, the DUT (305) generates a stimulus waveform (307). The DUT may generate the stimulus waveform (307) as a result of internal processes, interactions with other components (205), and in response to test data (207) provided to the DUT. The test data may include data needed to initiate the simulation and to establish and maintain the simulation environment (407). The test data is typically implemented as test cases expressed in HDL. The simulated hardware device (303) receives the stimulus waveform (307) and responds to the DUT (305) with a response waveform (313) if a suitable response waveform (313) is available. The simulated hardware device (303) also records the stimulus waveform (307) in a stimulus file (201) in memory (713). If no suitable response waveform (313) is available, the device interface tool (403) presents the stimulus waveform (307) to the hardware device (319). The hardware device generates a response waveform, which the device interface tool saves in response file (315) in memory (713). The simulated hardware device (303) is provided access to the response waveform (313). The simulated hardware device (303) then has a response waveform (313) responsive to the stimulus waveform (307) received from the DUT (305).

In view of this explanation, it is seen that the functions of the simulated hardware device (303) and the device interface tool (403) are somewhat complementary. The simulated hardware device effects its simulation by playing back to the DUT (305) responses to stimuli derived from the actual hardware device (319). The device interface tool, in its communications with the hardware device, emulates the SOC simulated by the DUT, and does so by playing back to the hardware device stimuli recorded from the DUT. By iteratively recording the stimulus waveform and then recording the response waveform, the stimulus file (201) and the response file (315) are populated and the behavioral model (100) is created.

Creating a behavioral model of a hardware device for use in a simulation environment in accordance with the present invention is generally implemented with computers, that is, with automated computing machinery. For further explanation, therefore, FIG. 3 sets forth a block diagram of automated computing machinery comprising an exemplary computer (152) useful in creating a behavioral model of a hardware device for use in a simulation environment according to embodiments of the present invention. The computer (152) of FIG. 3 includes at least one computer processor (156) or 'CPU' as well as random access memory (168) ('RAM') which is connected through a system bus (160) to processor (156) and to other components of the computer.

Stored in RAM (168) is a simulation environment module (407), computer program instructions for simulating computer hardware devices and interactions between simulated devices. Also stored in RAM (168) is a DUT module (305), computer program instructions for simulating a device under test. Also stored in RAM (168) is a simulated hardware device module (303), a set of computer program instructions for creating a behavioral model of a hardware device for use in a simulation environment according to embodiments of the present invention.

Also stored in RAM (168) is an operating system (154). Operating systems useful in computers according to embodiments of the present invention include UNIX™, Linux™, Microsoft NT™, AIX™, IBM's i5/OS™, and others as will occur to those of skill in the art. Operating system (154), DUT module (305), simulated hardware device module (303), and simulation environment module (407) in the example of FIG. 3 are shown in RAM (168), but many components of such software typically are stored in non-volatile memory (166) also.

Figure 3:
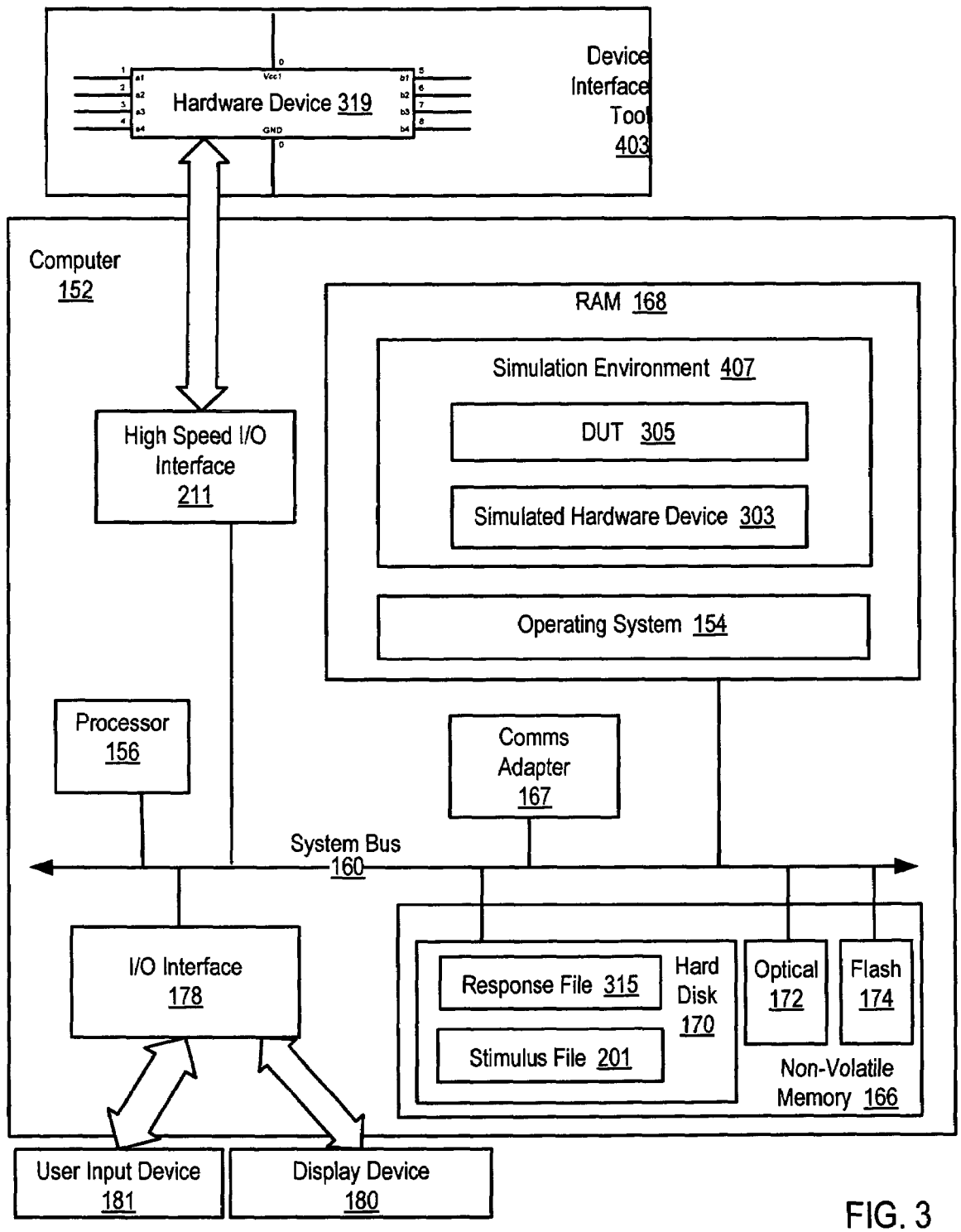
FIG. 3 sets forth a block diagram of automated computing machinery comprising an exemplary computer useful in creating a behavioral model of a hardware device for use in a simulation environment according to embodiments of the present invention.

Computer (152) of FIG. 3 includes non-volatile computer memory (166) coupled through a system bus (160) to processor (156) and to other components of the computer (152). Non-volatile computer memory (166) may be implemented as a hard disk drive (170), optical disk drive (172), electrically erasable programmable read-only memory space (so-called 'EEPROM' or 'Flash' memory) (174), RAM drives (not shown), or as any other kind of computer memory as will occur to those of skill in the art. Data useful in creating a behavioral model of a hardware device for use in a simulation environment according to embodiments of the present invention may be stored in non-volatile computer memory (166). For example, response file (315) and/or stimulus file (201) may be stored in non-volatile computer memory (166).

The example computer of FIG. 3 includes one or more input/output interface adapters (178). Input/output interface adapters in computers implement user-oriented input/output through, for example, software drivers and computer hardware for controlling output to display devices (180) such as computer display screens, as well as user input from user input devices (181) such as keyboards and mice.

The example computer of FIG. 3 also includes one or more high-speed input/output interface adapters (211). High-speed speed input/output interface adapters (211) implements data communications between computer (152) and a device interface tool (403) so that data can be presented to a hardware device (319).

The exemplary computer (152) of FIG. 3 includes a communications adapter (167) for implementing data communications (184) with other computers (not shown). Such data communications may be carried out serially through RS-232 connections, through external buses such as USB, through data communications networks such as IP networks, and in other ways as will occur to those of skill in the art. Communications adapters implement the hardware level of data communications through which one computer sends data communications to another computer, directly or through a network. Examples of communications adapters useful for determining availability of a destination according to embodiments of the present invention include modems for wired dial-up communications, Ethernet (IEEE 802.3) adapters for wired network communications, and 802.11b adapters for wireless network communications.

Figure 4:
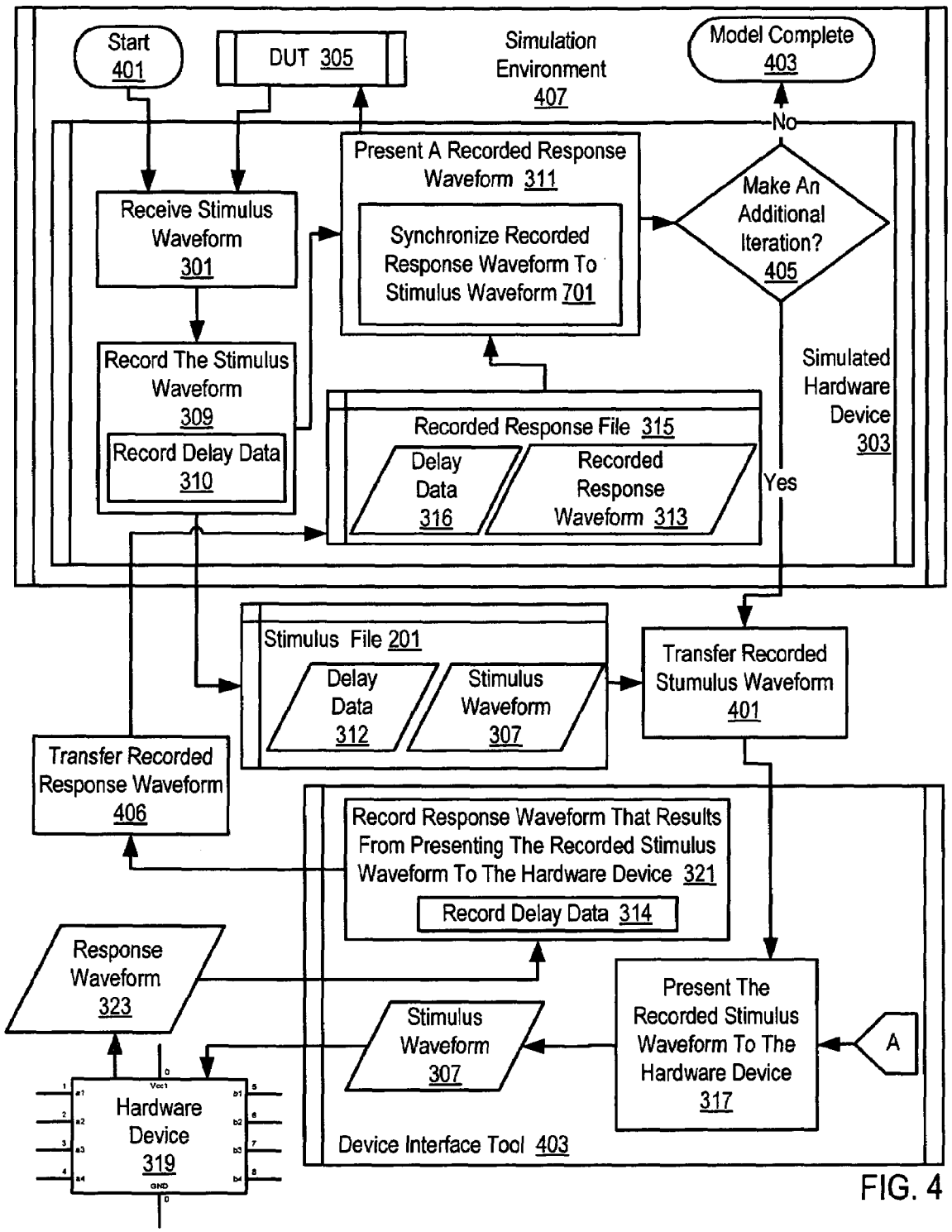
FIG. 4 sets forth a flow chart illustrating an exemplary method for creating a behavioral model of a hardware device for use in a simulation environment according to embodiments of the present invention.

For further explanation, FIG. 4 sets forth a flow chart illustrating an exemplary method for creating a behavioral model of a hardware device for use in a simulation environment according to embodiments of the present invention. For clarity of description, the discussion of the method of FIG. 4 begins at start block (401). The method of FIG. 4 includes receiving (301) in a simulated hardware device (303) from a simulated device under test ('DUT') (305) a stimulus waveform (307). The DUT (305) typically generates the stimulus waveform in response to test data (not shown in FIG. 4) input to the DUT (305) and/or due to internal processes of the DUT (305). The stimulus waveform (307) is communications from the DUT (305) to the simulated hardware device (303) which simulates communications from the device simulated by the DUT (not shown) to the hardware device (319).

In a typical example where the hardware device is a memory circuit, the stimulus waveform (307) includes one or more instructions to read data from memory. In such an embodiment, the stimulus waveform includes one or more data addresses. Persons skilled in the art will recognize immediately; however, that the method of creating a behavioral model of a hardware device for use in a simulation environment illustrated in FIG. 4 may be used to create a behavior model of many types of computer hardware devices and is not limited to memory devices. In the method of FIG. 4, for example, the hardware device (319) may be any computer or electronic component including a microprocessor, a microcontroller, Flash memory, an EEPROM, a universal asynchronous receiver-transmitter ('UART'), a parallel port, a DMA controller, and so on, as will occur to those of skill in the art.

The exemplary method of FIG. 4 also includes recording (309) the stimulus waveform (307). For example, the stimulus waveform (307) may be recorded in a stimulus file (201).

By recording the stimulus waveform (307) in the stimulus file (201), the stimulus waveform (307) is made available for access in creating a behavioral model of a hardware device according to embodiments of the present invention.

The method of FIG. 4 also includes, responsive to receiving the stimulus waveform (307), presenting (311) a recorded response waveform (313) from a recorded response file (315) to the DUT (305) by the simulated hardware device (303). The recorded response waveform (313) simulates output from the hardware device (319) to the SOC simulated by the DUT (305). If, for example, the hardware device (319) were a memory, then recorded response waveform (313) may include data read from the memory in response to stimuli from the DUT (305) presented as read instructions to the memory via the stimulus waveform (307).

The method of FIG. 4 also includes synchronizing (701) the recorded response waveform (313) to the stimulus waveform (307) while presenting (311) recorded response waveform (313) to the DUT (305). Such synchronization allows the communications between the DUT (305) and the simulated hardware device (303) to more accurately simulate communications between the SOC simulated by the DUT and the hardware device (319).

In the method of FIG. 4, synchronizing (701) the recorded response waveform (313) to the stimulus waveform (307) while presenting (311) recorded response waveform (313) to the DUT (305) is accomplished by including delay data in the stimulus waveform. In the method of FIG. 4, for example, recording (309) the stimulus waveform (307) includes recording (310) delay data (312) representing delays between presentation of a response and receipt of a next stimulus, and recording (321) a response waveform (323) includes recording (314) delay data (316) representing a delay between receipt of a stimulus and presentation of a corresponding response. Recorded delay data (316) is used by the simulated hardware device to delay presenting a response to the DUT until an amount of time has passed after receipt of the stimulus to represent the delay between receipt of a stimulus by the hardware device and presentation of a corresponding response to the device interface tool. Recorded delay data (312) is used by the device interface tool to delay presenting a stimulus to the hardware device until an amount of time has passed after receipt of a response from the hardware device to represent the delay between receipt of a response by the DUT and presentation of a subsequent stimulus to the simulated hardware device.

The steps of receiving (301) the stimulus waveform (307), recording (309) the stimulus waveform (307) and presenting (311) a recorded response waveform (313) to the DUT (305) are collectively referred to in this specification as a 'simulation run.' One simulation run includes each of these steps at least once. However, until the behavioral model is complete (403), each simulation run will be incomplete due to lack of a full recorded response waveform (313) to present to the DUT (305) for the last stimulus waveform (307) received from the DUT (305). Once the model is complete (403), a simulation run will may include iteratively repeating each of these steps many times. Until the model is complete (403), each simulation run ends when it is determined (405) that an additional model creation iteration is needed to generate an additional recorded response waveform (313) to present to the DUT (305) in response to a received stimulus waveform (307).

The method of FIG. 4 also includes presenting (317) the recorded stimulus waveform (307) to the hardware device (319). The stimulus waveform (307) is presented to the hardware device (319) in a manner that emulates the hardware device's (319) receiving the stimulus waveform (317) from the SOC simulated by the DUT. By presenting the hardware device (319) with the stimulus waveform (317), the hardware device (319) is caused to respond to the stimulus waveform (317) by generating a response waveform (323).

The method of FIG. 4 further includes recording (321) in the recorded response file (315) the response waveform (323) that results from presenting (317) the recorded stimulus waveform (307) to the hardware device (319). By recording the response waveform (323) in the recorded response file (315), the recorded response waveform (313) is made available for use in simulation runs.

The steps of presenting (317) the recorded stimulus waveform (307) to the hardware device (319), and recording (321) the response waveform (323) that results are collectively referred to herein as a 'model creation iteration.', or simply an 'iteration.' Each model creation iteration results in a pairing of a recorded response waveform (313) with a recorded stimulus waveform (307). The behavior model created by the present invention is complete (403) when each element of stimulus data in a stimulus waveform (307) received by the simulated hardware device (303) from the DUT (305) has a corresponding element of response data in a recorded response waveform (313).

The method of FIG. 4 includes transferring (401) the recorded stimulus waveform (307) to a device interface tool (403) and carrying out through the device interface tool the steps of presenting (317) the recorded stimulus waveform (307) to the hardware device (319) and recording (321) the response waveform (323) that results. Transferring (401) the recorded stimulus waveform (307) to the device interface tool (403) may include electronic communication of the recorded stimulus waveform (307), physical relocation of a memory on which the recorded stimulus waveform (307) is stored, or other methods of transferring the stimulus waveform as will be apparent to those skilled in the art.

The device interface tool (403) may be implemented as a field programmable gate array ('FPGA'). Such an FPGA may be programmed to interact with the hardware device (319) in a manner that emulates interaction between the hardware device (319) and the SOC simulated by the DUT. The FPGA may record the stimulus waveform (307) in RAM on the FPGA or read the stimulus waveform from external non-volatile storage for presentation to the hardware device (319). The FPGA may then record the response waveform (323) from the hardware device that results from presenting the recorded stimulus waveform (307) to the hardware device (319).

The method of FIG. 4 also includes transferring (406) the recorded response waveform (313) from the device interface tool (403) to the simulation environment (407) and carrying out through the simulation environment (407) the steps of receiving (301) the stimulus waveform (307), recording (309) the stimulus waveform (307), and presenting (311) the recorded response waveform (313). Transferring (406) the recorded response waveform (313) from the device interface tool (403) may include electronic communication of the recorded response waveform (313), physical relocation of a memory on which the recorded response waveform (313) is stored, or other methods of transferring the recorded response waveform as will be apparent to those skilled in the art.

Figure 5A:
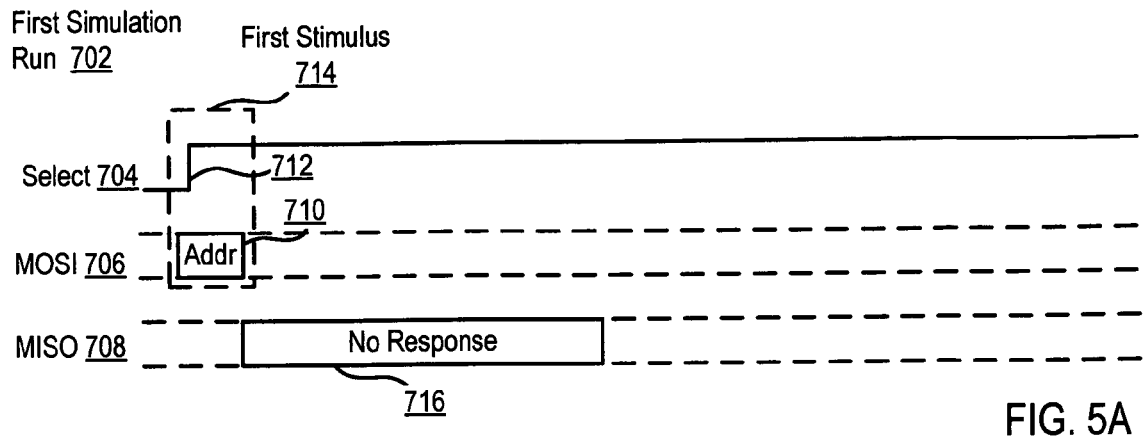
FIGS. 5A-5D set forth line drawings illustrating communications in a method of creating a behavioral model of a hardware device for use in a simulation environment according to embodiments of the present invention.

For further explanation, FIGS. 5A-5D set forth line drawings illustrating communications in a method of creating a behavioral model of a hardware device for use in a simulation environment according to embodiments of the present invention. The communication signals depicted in FIGS. 5A-5D generally follow the style used to illustrate communications in a serial peripheral interface ('SPI') environment; however, the present invention is not limited to SPI communications. SPI is a particular example of a serial data communications interface, but there are many other forms of serial interface compatible with embodiments of the present invention and many parallel interfaces also. Any form of data communications as will occur to those of skill in the art may be used between a device interface tool and a hardware device, and all such forms are well within the scope of the present application. Also in FIGS. 5A through 5D, 'first', and 'second' are not intended to indicate an absolute ordinal position, merely relative order. That is, the first simulation run (702) of FIG. 5A is not necessarily the initial simulation run. Rather, 'first' is used simply to distinguish first simulation run (702) from subsequent simulation runs, e.g., second simulation run (740). Similarly, first model creation iteration (720) of FIG. 5B merely indicates that first model creation iteration (720) precedes second model creation iteration (750).

FIG. 5A depicts communication signals during first simulation run (702) between a DUT and a simulated hardware device for use in a simulation environment. In FIG. 5A, first simulation run (702) includes a select signal (704), a master output, slave input ('MOSI') signal (706), and a master input, slave output ('MISO') signal (708). During first simulation run (702), a selection signal (712) is sent from the DUT to the simulated hardware device on select signal (704). Additionally, an address (710) is sent from the DUT to the simulated hardware device on MOSI signal (706). Together address (710) and selection signal (712) form a first stimulus (714). Address (710) is typically an address where desired data is stored. The simulated hardware device receives the first stimulus (714); however, no response is available in the simulated hardware device to provide to the DUT. Thus, the simulation run ends with no response (716) from the simulated hardware device to the DUT, and a model creation iteration is initiated. The first stimulus (714) is recorded and transferred to a device interface tool.

Figure 5B:
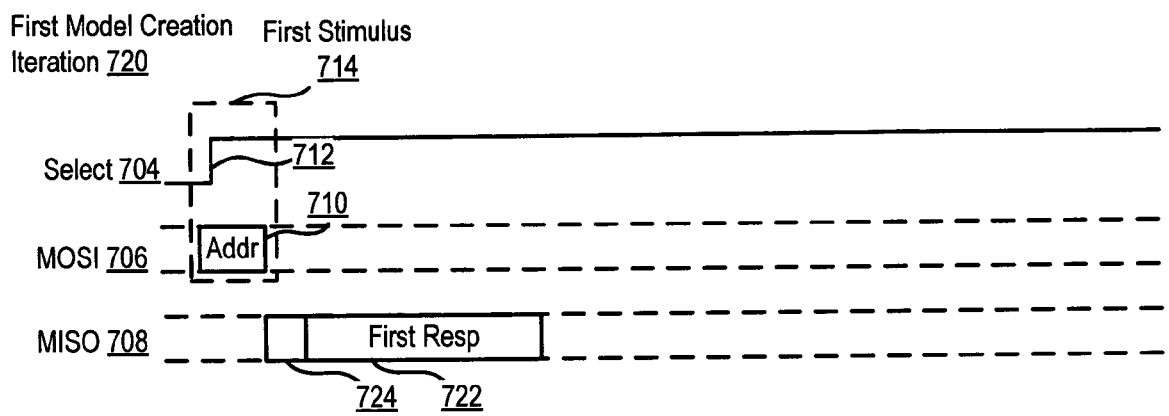

FIG. 5B depicts communication signals during a first model creation iteration (720) between a hardware device and the device interface tool. The first model creation iteration (720) includes sending first recorded stimulus (714), including a selection signal (712) and an address (710), via a select signal (704) and a MOSI signal (706) to the hardware device. After some delay (724), the hardware device responds by sending a first response (722) via MISO signal (708). For example, the first response (722) typically includes data from a data address corresponding to address (710). The first response (722) and delay data (724) are recorded and transferred back to the simulation environment.

Figure 5C:
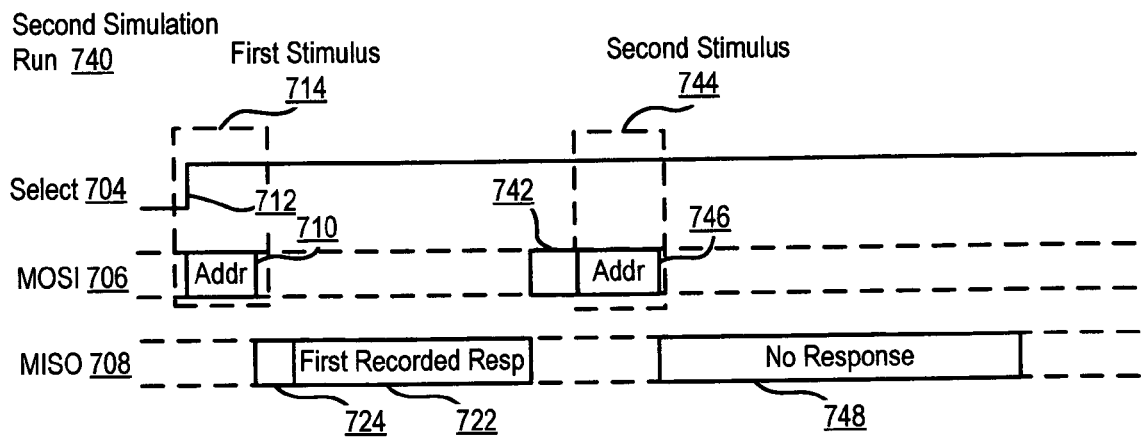

FIG. 5C depicts a second simulation run (740) in the simulation environment. Second simulation run (740) includes receiving first stimulus (714) from the DUT by the simulated hardware device. After a delay (724), recorded first response (722) is presented to the DUT by the simulated hardware device in response to the first stimulus (714). At some point later in second simulation run (740) after delay (742), a second stimulus (744), including address (746), is received by the simulated hardware device from the DUT. The simulated hardware device does not have a response waveform responsive to the second stimulus (744), therefore the second simulation run (740) ends with no response (748) from the simulated hardware device.

Figure 5D:
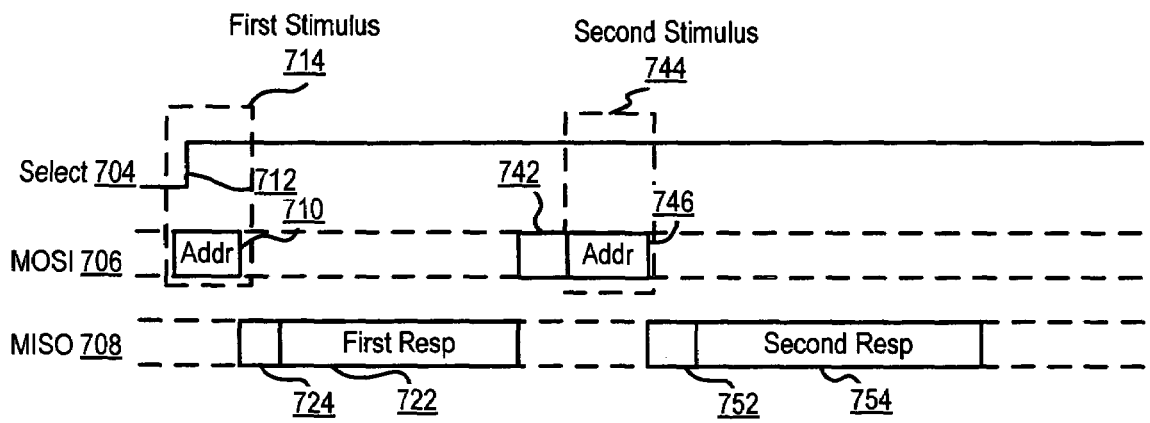

FIG. 5D depicts communication signals during a second model creation iteration (750) between a hardware device and the device interface tool. The second model creation iteration (750) includes the device interface tool sending first recorded stimulus (714) to the hardware device. After some delay (724), the hardware device responds by sending first response (722) via MISO signal (708). After delay (742), the device interface tool sends recorded second stimulus (744) to the hardware device. Hardware device responds to second stimulus (744) by sending second response (754), after some delay (752). The first response (722), delay data (724), second response (754) and delay data (752) are recorded and transferred back to the simulation environment. Subsequent simulation runs and model creation iterations may follow until the behavior model of the hardware device is complete.

Figure 6:
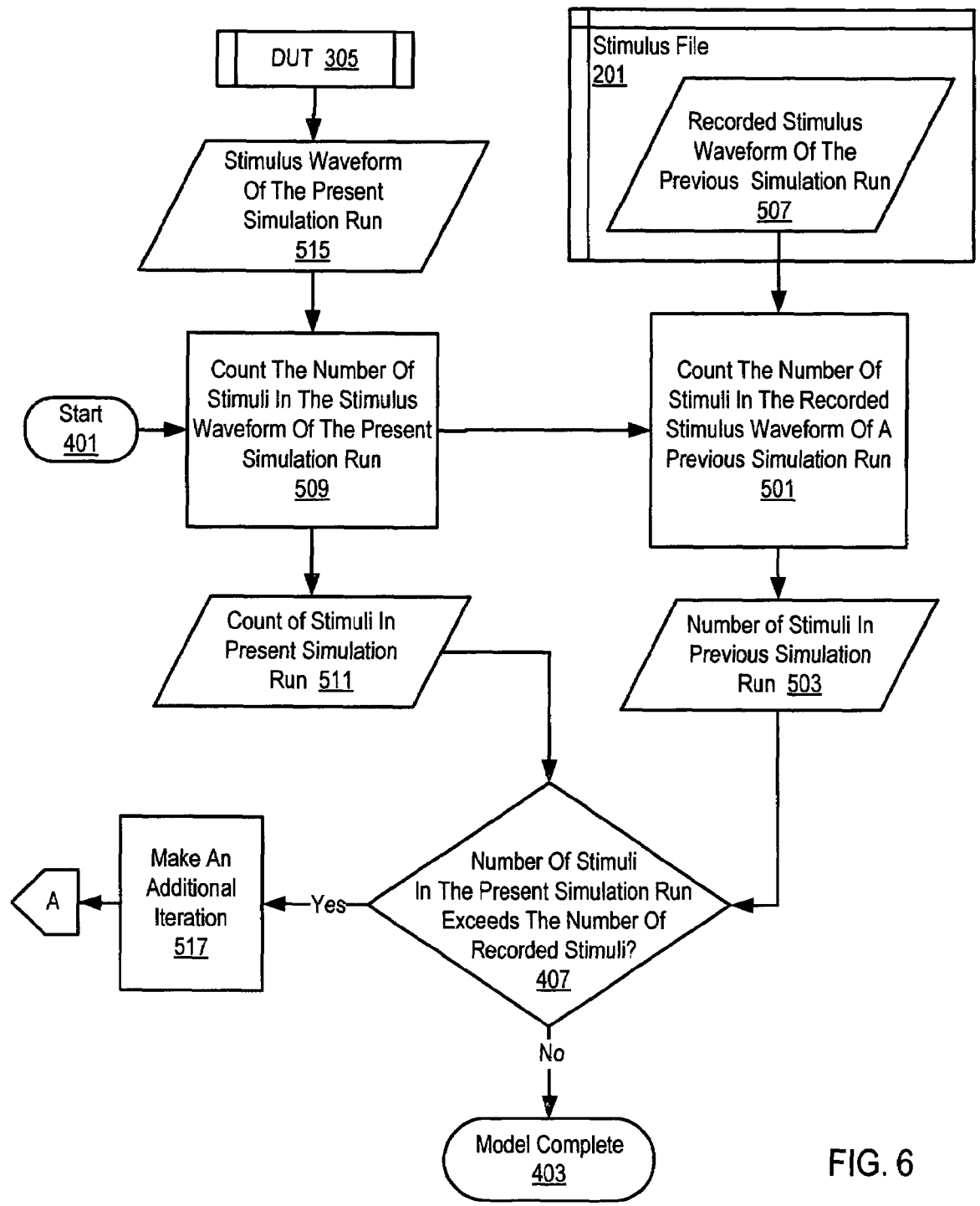
FIG. 6 sets forth a flow chart illustrating an exemplary method for determining whether an additional iteration is required in a method of creating a behavioral model of a hardware device for use in a simulation environment according to embodiments of the present invention.

For further explanation, FIG. 6 sets forth a flow chart illustrating an exemplary method for determining whether an additional iteration is required in a method of creating a behavioral model of a hardware device for use in a simulation environment according to embodiments of the present invention. The method of FIG. 6 includes counting (501) the number of stimuli (503) in the recorded stimulus waveform of a previous simulation run (507). The recorded stimulus waveform of the previous simulation run (507) is stored in the stimulus file (201).

The method of FIG. 6 further includes counting (509) the number of stimuli (511) in the stimulus waveform of the present simulation run (515). The stimulus waveform of the present simulation run (515) may be counted by, for example, zeroing a counter upon beginning the present simulation run and incrementing the counter every time a stimulus is received.

Counting stimuli is one method for determining whether an additional iteration is required. Another method for determining whether an additional iteration is required is to compare the two waveforms beginning at a timestamp where the last difference was detected, rather that comparing from the beginning on each iteration.

The method of FIG. 6, includes making (517) an additional iteration only if the number of stimuli in the present simulation run (511) exceeds the number of stimuli in the recorded stimulus waveform of a previous simulation run (503), as indicated by decision block (407). If more stimuli are present in the stimulus waveform of the present simulation run (515) than were present in the stimulus waveform of the previous simulation run (507), then no response to the last stimulus of the stimulus waveform received in the present simulation run is available in the recorded response file. If the decision (407) is to make an additional model creation iteration (517), then the method of FIG. 6 returns to FIG. 4, as indicated by off-page reference blocks A in FIG. 6 and FIG. 4.

Figure 7:
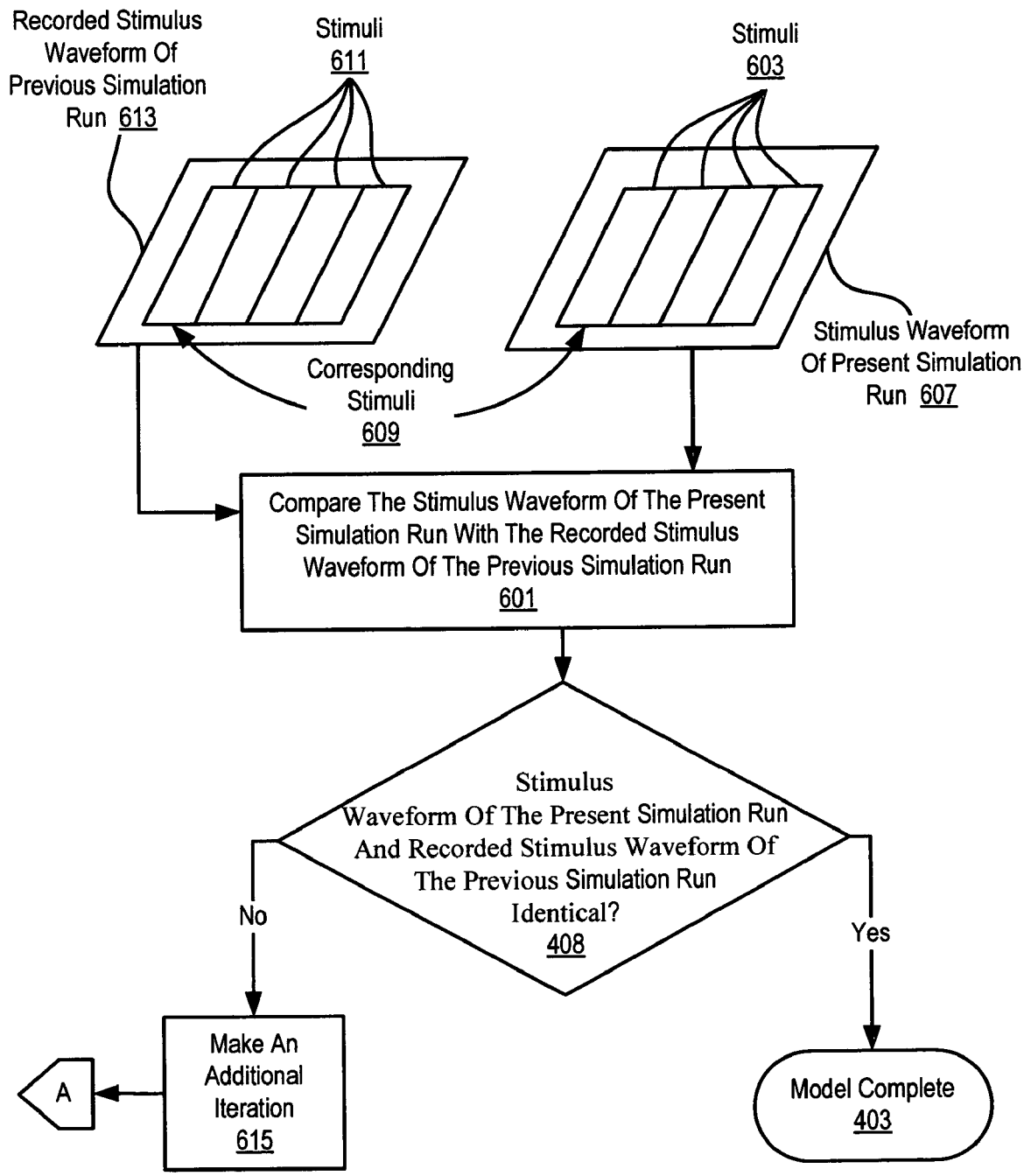
FIG. 7 sets forth a flow chart illustrating an exemplary method of determining whether an additional iteration is required in a method of creating a behavioral model of a hardware device for use in a simulation environment according to embodiments of the present invention.

FIG. 7 sets forth a flow chart illustrating an exemplary method of determining whether an additional iteration is required in a method of creating a behavioral model of a hardware device for use in a simulation environment according to embodiments of the present invention. The method of FIG. 7 includes comparing (601) the stimulus waveform of the present simulation run (607) with the recorded stimulus waveform of the previous simulation run (613), and making (615) an additional iteration only if the stimulus waveform of the present iteration (607) and the recorded stimulus waveform of the previous iteration (613) are not identical.

In the method of FIG. 7, each stimulus waveform (607, 613) includes one or more stimuli (611, 603). Additionally, one or more stimuli (603) of the stimulus waveform of the present simulation run (607) may correspond (609) to one or more stimuli (611) of the recorded stimulus waveform of the previous simulation run (613). For example, referring briefly to FIGS. 5A and 5C, first stimulus (460) of first simulation run (450) corresponds to first stimulus (460) of the second simulation run (478).

Returning to the method of FIG. 7, the stimulus waveform of the present simulation run (607) may be usefully compared with the recorded stimulus waveform of the previous simulation run (613) in several ways. In an embodiment, each of the stimuli (603) of the stimulus waveform of the present simulation run (607) is compared with a corresponding stimulus (609) of the recorded stimulus waveform of the previous simulation run (613). If a stimulus (603) of the stimulus waveform of the present simulation run (607) does not have a corresponding stimulus (609) among the stimuli (611) of the recorded stimulus waveform of the previous simulation run (613), then the decision at decision block (408) is that the stimulus waveform of the present simulation run and the recorded stimulus waveform of the previous simulation run are not identical. Therefore, the method determines to make an additional iteration (615) and returns to the method of FIG. 4 as illustrated by off-page reference block A.

In another embodiment, the method of FIG. 7 executes at the end of a simulation run. In such an embodiment, the entire stimulus waveform of the present simulation run (607) is comparing (601) with the entire recorded stimulus waveform of the previous simulation run (613). If the waveforms (607, 613) are identical, the model is complete (403). If the waveforms are not identical, then at least one additional model creation iteration is needed to complete the model, so the decision at decision block 408 is to make (615) an additional iteration. The method therefore returns to the method of FIG. 4 as illustrated by off-page reference block A.

For further explanation, a pseudocode example of a waveform player that may be adapted to operate either as a device interface tool or a simulated hardware device for creating a behavioral model of a hardware device according to embodiments of the present invention is set forth below. 'Pseudocode' is an example of creating a behavioral model of a hardware device according to embodiments of the present invention presented for convenience of explanation in the form of computer program code, not an actual working model and not a form of code in any particular programming language.

In another exemplary embodiment, an HDL module adapted from the psuedocode example below may be used to implement a simulated hardware device. In order to provide a clear description, the example below describes the function of the pseudocode as a device interface tool. As will be apparent to those of skill in the art, there will be differences between actual program code written to implement a simulated hardware device and actual program code written to implement a device interface tool. For example, to implement a device interface tool, the pseudocode is adapted to present a stimulus waveform to a hardware device; whereas, to implement a simulated hardware device, the pseudocode is adapted to present a response waveform to a device under test. Accounting for such differences when implementing actual program code is well within the skill of those of ordinary skill in the art.

The following pseudocode example is expressed in a syntax of an example HDL similar to Verilog or VHDL—useful, for example, in an exemplary embodiment in which a device interface tool is implemented as an FPGA. The use of HDL in this example is for explanation only, not a limitation of the present invention. When a device interface tool is implemented on a personal computer or workstation with a high-speed I/O port instead of an FPGA, the C programming language may be preferred to an HDL, for example. When a device interface tool is implemented as an embedded controller, for a further example, then an assembly language may be preferred to an HDL.

A pseudocode example of a software module implementing a waveform player:

```
module wave_player( RST_, CLK, SPI_CLK, SPI_SO, SPI_EN_n,
        SPI_SI);
    input RST_, CLK, SPI_SI;
    inout SPI_CLK, SPI_EN_n, SPI_SO;
    wire  sigm, init, spi_en_ram, spi_so_ram, spi_clk_ram,
        spi_en_oe, spi_clk_oe, spi_so_oe,
        [0:8] Pc, [7:0] delay, [7:0] data;
    wire rst; // active '1' reset
    wire zcnt; // zero count of delay
    wire dec; // decrement delay counter
    wire inc;   // increment program counter
    wire endd; // end of program, program counter == 9'h1FF
    assign sigm   = (inc || init);
    RAMB4_S8 data_mem (.WE(1'b0), .EN(sigm), .RST(1'b0),
        .CLK(CLK), .ADDR(pc[0:8]), .DI(8'h00), .DO(data[7:0]));
    RAMB4_S8 delay_mem (.WE(1'b0), .EN(1'b1), .RST(1'b0),
        .CLK(CLK), .ADDR(pc[0:8]), .DI(8'h00), .DO(delay[7:0]));
    player_state player_state( .clk(CLK ),    .rst(rst) ,
        .zcnt(zcnt),     .last(endd),
        .inc(inc),     .dec(dec),
        .load(load),    .init(init),
        .spi_si(SPI_SI), .spi_en(SPI_EN_n),
        .spi_clk(SPI_CLK), .data_0(data[0]));
    pc_mod pc_mod( .clk(CLK), .rst(rst), .inc(inc),
        .pc( pc ), .endd( endd ));
    count count( .clk(CLK), .rst(rst), .dec( dec ),
        .in( delay[7:0] ), .load(load), .zcnt( zcnt ) );
    assign rst = ! RST_;
    assign spi_en_oe     = ~data[5];
    assign spi_en_ram    = data[4];
    assign spi_clk_oe    = ~data[7];
    assign spi_clk_ram   = data[6];
    assign spi_so_oe     = ~data[3];
    assign spi_so_ram    = data[2];
    assign SPI_EN_n = ( spi_en_oe ? spi_en_ram : 1'bz );
    assign SPI_CLK = ( spi_clk_oe ? spi_clk_ram : 1'bz );
    assign SPI_SO = ( spi_so_oe ? spi_so_ram : 1'bz );
endmodule
```

This example implements a waveform player named wave_player having nodes for a reset input ('RST_'), a clock input ('CLK'), and an SPI serial input ('SPI_SI'). SPI_SI is an input node that corresponds to an MISO, master input slave output in SPI standard terminology. Wave_player also has bidirectional nodes ('inouts') for an SPI clock ('SPI_CLK'), an SPI enable ('SPI_EN_n'), and an SPI serial output ('SPI_SO'). SPI_SO corresponds to an MOSI, master output slave input in SPI standard terminology.

Wave_player instantiates the following signals or 'wires':

sigm - assigned to inc or init
init - a signal indicating 'init and reset' state of the state machine 'player_state'
spi_en_ram - the SPI enable signal from a recorded stimulus waveform, assigned to data array bit data [4]
spi_so_ram - the SPI serial output signal from a recorded stimulus waveform, assigned to data array bit (data [2])
spi_clk_ram - the SPI clock signal from a recorded stimulus waveform, assigned to data array bit data [6] to generate driver enables
spi_en_oe - a tri-state output enable for the SPI enable signal, assigned to the inverse of bit 5 of the data array (~data [5])
spi_clk_oe - a tri-state output enable assigned to the inverse of bit 7 of the data array (~data [7])
spi_so_oe - a tri-state output enable assigned to the inverse of bit 3 of the data array (~data [3])
[0:8] pc - program counter signals
[7:0] delay - state duration delay signal
[7:0] data - output data signals from the memory named 'data_mem,' providing the recorded stimulus waveform to wave_player signal
rst - active '1' reset signal
zcnt - zero count of delay counter
dec - signal to decrement delay counter
inc - increment signal for program counter
endd - signal indicating end of program In Verilog, anything on the left hand side of a procedural assignment (an assignment in an 'always' block) must be declared as a register data type. Everything else in Verilog, including any signal used in a Verilog 'continuous assignment,' is a net data type, including, for example, a 'wire.'. A VHDL 'process' is roughly equivalent to a Verilog 'always' block and a VHDL 'concurrent signal assignment' is roughly equivalent to a Verilog 'continuous assignment,' but VHDL does not require different data type declarations for process and concurrent signal assignments. In VHDL, 'signals' are commonly used in place of both Verilog register and net data types. In this specification, subject to context, the terms 'signal,' 'wire,' and 'register' are used as synonyms.

Wave_player instantiates two FPGA memories each of 512 8-bit bytes, one named 'data_mem' and another named 'delay_mem.' Data_mem provides signals in an 8-bit array named 'data' for each recorded stimulus signal of a recorded stimulus waveform to be played to a hardware device across an SPI bus. The recorded stimulus signals are named SPI_CLK, SPI_EN, and SPI_SO, corresponding as mentioned above to the SPI bus lines for an SPI clock, an SPI enable line, and an SPI MOSI line.

The waveform data is encoded into a 2 bit field for each output signal:
    assign spi_en_oe=~data[5];
    assign spi_en_ram=data[4];
    assign spi_clk_oe=~data[7];
    assign spi_clk_ram=data[6];
    assign spi_so_oe=~data[3];
    assign spi_so_ram=data[2];

The 2 bit encoding allows for 4 output states being logic "0", logic "1," tri-state, and a reserved state. This makes 3×2=6 bits. The other two bits store expected value of the input, SPI_SI, allowing for "on the fly" checking of the response of the SPI hardware device versus the simulation expected result, that is, a response value from a recorded response waveform. The second memory, 'delay_mem,' contains a delay count which specifies the delay in clock counts for which the values in the corresponding data memory, 'data_mem,' are output through the 'data' wires.

Wave_player also instantiates a state machine named 'player_state' which is responsible for sequencing through the stimulus data and delay memory from a first memory location through the last memory location in a simulation run. Player_state also interacts with a program counter named 'pc' and the delay counter, here named 'count.' The function of the program counter is to store the current address being presented to the data_mem and delay_mem memories. The function of the delay counter is to count out the delay specified for each stimulus in the recorded stimulus waveform.

A pseudocode example of player_state is:

```
module player_state( init, load, inc, dec, clk, rst, last,
        zcnt, spi_si, spi_en, spi_clk, data_0 );
    output   init, load, inc, dec;
    input    clk, rst, last, zcnt, spi_si, spi_en, spi_clk, data_0;
    wire   load, rst;
```

-continued

```
reg [5:1] state, next_state;
reg   fail, spi_clk_d, spi_clk_dd, spi_si_d, spi_si_dd;
parameter MWS_INIT = 1; // init and reset state
parameter MWS_LOAD = 2; // load fpga RAM signals
parameter MWS_CNT = 3; // decrement delay counter
parameter MWS_INC = 4; // incrememnt program counter
parameter MWS_END = 5; // end state
parameter MWS_WAIT = 6; // delay count
wire mws_load = state[MWS_LOAD], mws_inc = state[MWS_INC],
    mws_cnt = state[MWS_CNT], mws_init = state[MWS_INIT],
    spi_clk_rising;
assign init = mws_init, load = mws_load, inc = mws_inc,
dec = mws_cnt;
always @ (posedge clk or posedge rst)
    if(rst) state <= 5'b00001;
    else state <= next_state;
always @ ( rst or state or last or zcnt )
begin
    next_state = 5'b00000; // clear next_state
    casex ( 1'b1 )
        state[MWS_INIT]: next_state[MWS_LOAD] = 1;
        state[MWS_LOAD]: next_state[MWS_CNT] = 1;
        state[MWS_CNT]: if(zcnt) next_state[MWS_INC] = 1;
            else next_state[MWS_CNT] = 1;
        state[MWS_INC]: if(last) next_state[MWS_END] = 1;
            else next_state[MWS_WAIT] = 1;
        state[MWS_WAIT]: next_state[MWS_LOAD] = 1;
        state[MWS_END]: next_state[MWS_END] = 1;
        default:    next_state[MWS_INIT] = 1;
    endcase
end
always @ (posedge clk or posedge rst)
    if(rst) begin spi_clk_d <= 0; spi_si_d <= 1; spi_si_dd <= 1;
    end
    else begin spi_clk_d <= spi_clk; spi_si_d <= spi_si;
        spi_si_dd <= spi_si_d;
    end
assign spi_clk_rising = (spi_clk && !spi_clk_d);
always @ (posedge clk or posedge rst)
    if( rst ) fail <= 1'b0;
    else if ((fail == 0) && (spi_clk_rising == 1)
            && (spi_en == 0))
        if ((spi_si !== data_0) && (spi_si_d !== data_0)
            && (spi_si_dd !== data_0))
            fail <= 1'b1;
endmodule
Wave_player, when it instantiates player_state by:
player_state player_state( .clk(CLK ),      .rst(rst) ,
    .zcnt(zcnt),    .last(endd),
    .inc(inc),      .dec(dec),
    .load(load),    .init(init),
    .spi_si(SPI_SI),  .spi_en(SPI_EN_n),
    .spi_clk(SPI_CLK), .data_0(data[0]));
``` maps player_state's nodes to signals in wave_player as follows:

clk maps to CLK, a system clock for a device interface tool or a simulated hardware device rst maps to rst, an active '1' reset signal zcnt maps to zcnt, the zero count of the delay counter last maps to endd, a signal indicating end of program inc maps to inc, the increment signal for program counter dec maps to dec, the signal to decrement the delay counter load maps to load, a load signal for the delay counter init maps to init, a signal for the 'init and reset' state of player_state spi_si maps to SPI_SI, a node for response data from a hardware device spi_en maps to SPI_EN_n, a node for an SPI enable signal from a recorded stimulus waveform spi_clk maps to SPI_CLK, a node for an SPI clock signal from a recorded stimulus waveform data_0 maps to data[0], a node for an expected response signal from a hardware device (recorded in a previous iteration)

Player_state declares parameters representing the following machine states:

parameter MWS_INIT=1; //init and reset state
parameter MWS_LOAD=2; //load fpga RAM signals
parameter MWS_CNT=3; //decrement delay counter
parameter MWS_INC=4; //incrememnt program counter
parameter MWS_END=5; //end state
parameter MWS_WAIT=6; //delay count Player_state instantiates the following signals or 'wires':

mws_load, a signal for the MWS_LOAD machine state
mws_inc, a signal for the MWS_INC machine state
mws_cnt, a signal for the MWS_CNT machine state
mws_init, a signal for the MWS_INIT machine state
spi_clk_rising, a signal representing a rising edge of an SPI clock signal Player_state, through 'continuous assignments,' assigns to init the value of the mws_init machine state, to load the value of the mws_load machine state, to inc the value of the mws_inc machine state, and to dec the value of the mws_cnt machine state.

Through the always block:

```
always @ (posedge clk or posedge rst)
    if(rst) state <= 5'b00001;
    else state <= next_state;
``` player_state clears the state signal on reset and moves to the next state of the state machine on a positive clock edge.

Player_state implements a sequence of machine states with the following always block, which executes when rst, state, last, or zcnt is true:

```
always @ ( rst or state or last or zcnt )
begin
    next_state = 5'b00000; // clear next_state
    casex ( 1'b1 )
        state[MWS_INIT]: next_state[MWS_LOAD] = 1;
        state[MWS_LOAD]: next_state[MWS_CNT] = 1;
        state[MWS_CNT]: if(zcnt) next_state[MWS_INC] = 1;
            else next_state[MWS_CNT]= 1;
        state[MWS_INC]: if(last) next_state[MWS_END] = 1;
            else next_state[MWS_WAIT] = 1;
        state[MWS_WAIT]: next_state[MWS_LOAD] = 1;
        state[MWS_END]: next_state[MWS_END] = 1;
        default:    next_state[MWS_INIT] = 1;
    endcase
end
```

This always block clears next_state and then:

if state is MWS_INIT, sets next_state to MWS_LOAD;
if state is MWS_LOAD] , sets next_state to MWS_CNT;
if state is MWS_CNT] , sets next_state to MWS_INC if zcnt is true, otherwise sets next_state to MWS_CNT;
if state is MWS_INC, sets next_state to MWS_END if last is true, that is, if all the response data has been played back to the hardware device, otherwise sets next_state to MWS_WAIT;
if state is MWS_WAIT, sets next_state to MWS_LOAD; and
if state is MWS_END, sets next_state to MWS_END.

Through the always block:

```
always @ (posedge clk or posedge rst)
    if(rst) begin spi_clk_d <= 0; spi_si_d <= 1; spi_si_dd <= 1;
    end
    else begin spi_clk_d <= spi_clk; spi_si_d <= spi_si;
        spi_si_dd <= spi_si_d;
    end,
``` player_state saves the current response the three most recent response data values from the hardware device in spi_si, spi_si_d, and spi_si_dd, which are sampled on the three most recent system clock positive edges, that is, the rising edge of the 'clk' signal. Then, in the always block:

```
always @ (posedge clk or posedge rst)
    if ( rst ) fail <= 1'b0;
    else if ((fail == 0) && (spi_clk_rising == 1)
            && (spi_en == 0))
        if ((spi_si !== data_0) && (spi_si_d !== data_0)
            && (spi_si_dd !== data_0))
            fail <= 1'b1;
``` player_state, by this test:

```
if ((spi_si !== data_0) && (spi_si_d !== data_0)
    && (spi_si_dd !== data_0))
    fail <= 1'b1;
``` detects a response error only if all three most recent response data values are equal to one another and not equal to the expected response value in data_0.

A pseudocode example of the delay counter is the following HDL module named 'count':

```
module count( clk, rst, dec, in, load, zcount);
    output zcount, dec;
    input        in, clk, rst, load;
    reg [8:1]    delay counter;
    assign zcnt = (delay[0:7] = 8'h01);
    always @ (posedge clk or posedge rst)
        if(rst)      delay counter <= 8'b000000000;
        else if (load) delay counter <= in;
        else if (dec) delay counter--;
endmodule
```

The nodes of the count module include an 'in' node mapped to the data output wires of the delay memory 'delay_mem' by the instantiation of the delay counter in wave_player:

```
count count( .clk(CLK), .rst(rst), .dec( dec ),
    .in( delay[7:0] ), .load(load), .zcnt( zcnt ) );
```

The count module instantiates an 8-bit register named 'delay counter' to hold the delay period for a recorded stimulus from the recorded stimulus waveform. Then, through the always block:

```
always @ (posedge clk or posedge rst)
    if(rst)      delay counter <= 8'b000000000;
    else if (load) delay counter <= in;
    else if (dec) delay counter--;
``` the count module clears the delay counter upon rst, loads the delay counter with the delay period for a recorded stimulus on the positive edge of the system clock if 'load' is true, and decrements the delay counter if 'dec' is true. With the continuous assignment:

assign zcnt=(delay[0:7]=8'h01);

the count module sets zcnt true when the delay counter value decrements to 1.

A pseudocode example of the program counter is the following HDL module named 'pc_mod':

```
module pc_mod(clk, rst, inc, pc, endd);
    input inc, clk, rst;
    output inc, endd;
    reg [9:1] pc;
    assign endd = (pc[9:1] == 9'h1ff)
    always @ (posedge clk or posedge rst)
        if (rst) pc <= 9'b000000000;
        else if (inc) pc++;
endmodule
```

The nodes of pc_mod include a 'pc' node mapped to the address signals of the memories 'data_mem' and 'delay_mem' by the instantiation of the program counter, pc_mod, in wave_player:

```
pc_mod pc_mod( .clk(CLK), .rst(rst), .inc(inc),
    .pc( pc ), .endd( endd ));
```

Pc_mod instantiates an 9-bit register named 'pc' to hold the current address of the recorded stimulus and delay data presented to the data memory 'data_mem' and the delay memory 'delay_mem.' The memories are 512 bytes each. Pc_mod sets signal 'endd' true when the value of pc reaches hexadecimal 1ff=decimal 255. Through the always block:

```
always @ (posedge clk or posedge rst)
    if (rst) pc <= 9'b000000000;
    else if(inc) pc++;
``` pc_mod clears Pc upon reset, rst=true, and if 'inc' is true on a positive clock edge, pc_mod increments the value of pc.

Exemplary embodiments of the present invention are described largely in the context of a fully functional computer system for creating a behavioral model of a hardware device for use in a simulation environment. Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A computer-implemented method for creating a behavioral model of a hardware device for use in a simulation environment, the method comprising iteratively carrying out the steps of:
    receiving in a simulated hardware device from a simulated device under test ('DUT') a stimulus waveform, the stimulus waveform comprising data representing a number of stimuli;
    recording the stimulus waveform, including recording delay data representing delays between presentation of a response and receipt of a next stimulus;
    responsive to receiving the stimulus waveform, presenting, by the simulated hardware device to the simulated DUT, a recorded response waveform from a recorded response file;
    presenting the recorded stimulus waveform to the hardware device;
    recording in the recorded response file a response waveform that results from presenting the recorded stimulus waveform to the hardware device, including recording delay data representing a delay between receipt of a stimulus and presentation of a corresponding response; and
    synchronizing the recorded response waveform to the stimulus waveform while presenting recorded response waveform to the simulated DUT.

2. The method of claim 1 further comprising transferring the recorded stimulus waveform to a device interface tool and carrying out through the device interface tool the steps of presenting the recorded stimulus waveform to the hardware device and recording the response waveform.

3. The method of claim 1 further comprising transferring the response waveform from a device interface tool to the simulation environment and carrying out through the simulation environment the steps of receiving the stimulus waveform, recording the stimulus waveform, and presenting the recorded response waveform.

4. The method of claim 1 further comprising determining whether an additional iteration is required, including:
    counting the number of stimuli in the recorded stimulus waveform of a previous simulation run;
    counting the number of stimuli in the stimulus waveform of the present simulation run; and
    making an additional iteration only if the count of stimuli in the present simulation run exceeds the number of stimuli in the recorded stimulus waveform of a previous simulation run.

5. The method of claim 1 further comprising determining whether an additional iteration is required, including:
    comparing the stimulus waveform of the present simulation run with the recorded stimulus waveform of the previous simulation run; and
    making an additional iteration only if the stimulus waveform of the present simulation run and the recorded stimulus waveform of the previous simulation run are not identical.

6. An apparatus for creating a behavioral model of a hardware device for use in a simulation environment, the apparatus comprising at least one computer processor, at least one computer memory operatively coupled to the computer processor, and computer program instructions disposed within the computer memory capable of:
    receiving in a simulated hardware device from a simulated device under test ('DUT') a stimulus waveform, the stimulus waveform comprising data representing a number of stimuli;
    recording the stimulus waveform, including recording delay data representing delays between presentation of a response and receipt of a next stimulus;
    responsive to receiving the stimulus waveform, presenting, by the simulated hardware device to the simulated DUT, a recorded response waveform from a recorded response file;
    presenting the recorded stimulus waveform to the hardware device;
    recording in the recorded response tile a response waveform that results from presenting the recorded stimulus waveform to the hardware device, including recording delay data representing a delay between receipt of a stimulus and presentation of a corresponding response; and
    synchronizing the recorded response waveform to the stimulus waveform while presenting recorded response waveform to the simulated DUT.

7. The apparatus of claim 6 further comprising computer program instructions capable of transferring the recorded stimulus waveform to a device interface tool and carrying out through the device interface tool the steps of presenting the recorded stimulus waveform to the hardware device and recording the response waveform.

8. The apparatus of claim 6 further comprising transferring the response waveform from a device interface tool to the simulation environment and carrying out through the simulation environment the steps of receiving the stimulus waveform, recording the stimulus waveform, and presenting the recorded response waveform.

9. The apparatus of claim 6 further comprising determining whether an additional iteration is required, including:
    comparing the stimulus waveform of the present simulation run with the recorded stimulus waveform of the previous simulation run; and
    making an additional iteration only if the stimulus waveform of the present simulation run and the recorded stimulus waveform of the previous simulation run are not identical.

10. A computer program product for creating a behavioral model of a hardware device for use in a simulation environment, the computer program product disposed upon a recordable medium, the computer program product comprising computer program instructions for:

receiving in a simulated hardware device from a simulated device under test ('DUT') a stimulus waveform, the stimulus waveform comprising data representing a number of stimuli;

recording the stimulus waveform, including recording delay data representing delays between presentation of a response and receipt of a next stimulus;

responsive to receiving the stimulus waveform, presenting, by the simulated hardware device to the simulated DUT, a recorded response waveform from a recorded response file;

presenting the recorded stimulus waveform to the hardware device;

recording in the recorded response file a response waveform that results from presenting the recorded stimulus waveform to the hardware device, including recording delay data representing a delay between receipt of a stimulus and presentation of a corresponding response; and synchronizing the recorded response waveform to the stimulus waveform while presenting recorded response waveform to the DUT.

11. The computer program product of claim 10 further comprising computer program instructions for transferring the recorded stimulus waveform to a device interface tool and carrying out through the device interface tool the steps of presenting the recorded stimulus waveform to the hardware device and recording the response waveform.

12. The computer program product of claim 10 further comprising transferring the response waveform from a device interface tool to the simulation environment and carrying out through the simulation environment the steps of receiving the stimulus waveform, recording the stimulus waveform, and presenting the recorded response waveform.

13. The computer program product of claim 10 further comprising determining whether an additional iteration is required, including:
   counting the number of stimuli in the recorded stimulus waveform of a previous simulation run;
   counting the number of stimuli in the stimulus waveform of the present simulation run; and
   making an additional iteration only if the count of stimuli in the present simulation run exceeds the number of stimuli in the recorded stimulus waveform of a previous simulation run.

14. The computer program product of claim 10 further comprising determining whether an additional iteration is required, including:
   comparing the stimulus waveform of the present simulation run with the recorded stimulus waveform of the previous simulation run; and
   making an additional iteration only if the stimulus waveform of the present simulation run and the recorded stimulus waveform of the previous simulation run are not identical.

* * * * *